United States Patent
Kozyrev (10) Patent No.: US 10,027,305 B1
(45) Date of Patent: Jul. 17, 2018

(54) FILTER INCLUDING NON-MAGNETIC FREQUENCY SELECTIVE LIMITERS

(71) Applicant: Rockwell Collins, Inc., Cedar Rapids, IA (US)

(72) Inventor: Alexander B. Kozyrev, Madison, WI (US)

(73) Assignee: ROCKWELL COLLINS, INC., Cedar Rapids, IA (US)

( * ) Notice: Subject to any disclaimer, the term of this patent is extended or adjusted under 35 U.S.C. 154(b) by 153 days.

(21) Appl. No.: 15/048,941

(22) Filed: Feb. 19, 2016

(51) Int. Cl.
 *H03H 7/01* (2006.01)
 *H03H 11/04* (2006.01)
 *H03H 17/02* (2006.01)

(52) U.S. Cl.
 CPC ........ *H03H 7/0138* (2013.01); *H03H 7/0107* (2013.01); *H03H 7/0115* (2013.01); *H03H 11/04* (2013.01); *H03H 11/0405* (2013.01); *H03H 17/0261* (2013.01)

(58) Field of Classification Search
 CPC ............... H03H 11/04; H03H 11/0405; H03H 17/0261; H03H 7/01; H03H 7/0107; H03H 7/0115; H03H 7/0138
 USPC .......................................... 333/174–177, 185
 See application file for complete search history.

(56) References Cited

U.S. PATENT DOCUMENTS

| | | | |
|---|---|---|---|
| 4,396,893 A | 8/1983 | Edson | |
| 5,323,126 A | 6/1994 | Spezio et al. | |
| 5,523,725 A | 6/1996 | Ishikawa et al. | |
| 6,549,560 B1* | 4/2003 | Maiuzzo | H01P 1/213 375/132 |
| 7,557,672 B1 | 7/2009 | Adam et al. | |
| 8,018,300 B2 | 9/2011 | Chen et al. | |
| 2013/0082801 A1* | 4/2013 | Rofougaran | H01L 23/5222 333/239 |
| 2015/0365063 A1* | 12/2015 | Geiler | H03H 7/24 333/81 R |

OTHER PUBLICATIONS

U.S. Appl. No. 14/720,164, filed May 22, 2015 Kozyrev, Alexander B.
Attílio J. Giarola, "A review of the theory, characteristics, and operation of frequency selective limiters", Proceedings of the IEEE, Oct. 1979, pp. 1380-1396, vol. 67, No. 10.
John D. Adam, "Mitigate the interference", IEEE Microwave Magazine, Sep./Oct. 2014, pp. 45-56.
Chien, "Frequency-Selective Limiter and its Application in a Filter Bank Receiver", Apr. 1973, NTIS.
(Continued)

*Primary Examiner* — Rakesh Patel
(74) *Attorney, Agent, or Firm* — Donna P. Suchy; Daniel M. Barbieri (57) ABSTRACT

A filter can be used in circuit. The filter includes a first stage including a first resonator configured to oscillate at a first fundamental frequency, a second resonator configured to oscillate at a second fundamental frequency, and a first nonlinear coupler for the first resonator and the second resonator. The second fundamental frequency being one half of the first fundamental frequency. The filter also includes a second stage including a third resonator, a fourth resonator, and a second nonlinear coupler for the third resonator and the fourth resonator.

20 Claims, 8 Drawing Sheets

(56) References Cited

OTHER PUBLICATIONS

Ho et al., "Passive Phase—Distortionless Parametric Limiting with Varactor Diodes", Nov. 1961, IRE Transactions on Microwave Theory and Techniques, pp. 459-472.
Non-Final Office Action on U.S. Appl. No. 14/720,164, dated Aug. 25, 2016, 12 pages.
Orth, "Frequency-Selective Limiters and Their Application", Jun. 1968, IEEE Transactions on Electromagnetic Compatibility vol. EMC-10, No. 2, p. 273-283.
Notice of Allowance on U.S. Appl. No. 14/720,164, dated Dec. 13, 2016, 7 pages.

* cited by examiner

FILTER INCLUDING NON-MAGNETIC FREQUENCY SELECTIVE LIMITERS

CROSS REFERENCE TO RELATED APPLICATIONS

The present application is related to U.S. application Ser. No. 14/720,164, filed Jun. 25, 2015, incorporated herein by reference in its entirety and assigned to the assignee of the present application.

BACKGROUND

Embodiments of the inventive concepts disclosed herein generally relate to the field of filters, and more particularly, but not by way of limitation, to filters including non-magnetic frequency selective limiters.

Radio frequency (RF) circuits are utilized in communication equipment, sensing equipment, and other applications. Generally, RF circuits often utilize limiters and filters. Frequency selective limiters (FSLs) are non-linear passive, two-port devices that can selectively attenuate undesired interference, thus improving the reception of desired signals. FSLs can be used in filters. An ideal FSL is capable of limiting the power of individual frequency components which are above a certain threshold level, without mutual interference or without affecting any other frequency components.

Conventional FSLs include ferrite or other magnetic material that attenuates signals above a predetermined threshold power level while passing signals below the threshold power level. The frequency selective nature of the magnetic material's high-power limiting characteristic is such that low power signals close in frequency to the limited signals are unaffected. FSLs including magnetic material have reduced design flexibility, are sensitive to temperature, are high cost, and are large in size and weight compared to printed circuit board components. Further, the magnetic materials often require permanent magnetic bias and are often limited to a fixed frequency range.

SUMMARY

In one aspect, the inventive concepts disclosed herein are directed to an apparatus for providing frequency selective power limiting. The apparatus includes a first resonator configured to oscillate at a first fundamental frequency, a second resonator configured to oscillate at a second fundamental frequency, and a first nonlinear coupler between the first resonator and the second resonator. The second fundamental frequency is one half of the first fundamental frequency.

In a further aspect, the inventive concepts disclosed herein are directed to a filter. The filter includes a first stage including a first non-magnetic resonator configured to oscillate at a first fundamental frequency, a second non-magnetic resonator configured to oscillate at a second fundamental frequency, and a first nonlinear coupler for the first resonator and the second resonator. The second fundamental frequency being one half of the first fundamental frequency. The filter also includes a second stage including a third resonator, a fourth resonator, and a second nonlinear coupler for the third resonator and the fourth resonator.

In a further aspect, the inventive concepts disclosed herein are directed to a filter. The filter includes a first stage comprising a first non-magnetic resonator configured to oscillate at a first fundamental frequency, a second non-magnetic resonator configured to oscillate at a second fundamental frequency, and a first nonlinear coupler for the first resonator and the second resonator. The second fundamental frequency is one half of the first fundamental frequency. The filter also includes a second stage comprising a third resonator configured to oscillate at a third fundamental frequency, a second resonator configured to oscillate at a fourth fundamental frequency, and a second nonlinear coupler for the third resonator and the fourth resonator. The fourth fundamental frequency is one half of the third fundamental frequency.

In a further aspect, the inventive concepts disclosed herein are directed to a method of frequency selective limiting of power of an input signal. The method includes providing the input signal through a first non-magnetic resonator configured to oscillate at a first fundamental frequency to provide a first filtered signal, providing the first filtered signal through a nonlinear coupler to provide a coupled signal, and providing the coupled signal to a second resonator configured to oscillate at a second fundamental frequency. The second fundamental frequency is one half of the first fundamental frequency.

In a further aspect, the inventive concepts disclosed herein are directed to a method of filtering an input signal. The method includes providing the input signal to staged filter. The staged filter includes a first stage and a second stage. The first stage includes a first non-magnetic resonator configured to oscillate at a first fundamental frequency, a nonlinear coupler, a second non-magnetic resonator configured to oscillate at a second fundamental frequency, and a pair of coupling circuits. The second fundamental frequency is one half of the first fundamental frequency. The second stage includes a third resonator, a fourth resonator, and a second nonlinear coupler between the third resonator and the fourth resonator. The first stage is in series or parallel with the second stage. The method also includes providing a filtered signal at an output of the staged filter.

BRIEF DESCRIPTION OF THE DRAWINGS

Some embodiments will hereinafter be described with reference to the accompanying drawings, wherein like numerals denote like elements and.

DETAILED DESCRIPTION OF EXEMPLARY EMBODIMENTS

System and methods according to the inventive concepts disclosed herein provide a wideband, non-magnetic frequency selective limiter (FSL) filter with reduced cost, size, and weight as compared to a magnetic frequency limiter. In some embodiments, the design of the FSL allows greater design flexibility. In some embodiments, a number of FSLs are implemented as an auto-tune filter using single stage, non-magnetic FSLs in series and/ or parallel. In some embodiments, the FSLs act as a high-quality factor (Q) (e.g., Q>1000) notch filter that automatically tunes to attenuate high power signals within a narrow frequency band. ($Q=f_c/\Delta f$ where $f_c$ is the center frequency and $\Delta f$ is the bandwidth of the limiter).

In some embodiments, the FSLs include a low pass filter type resonator and a high pass filter type resonator designed to oscillate at half the frequency of the low pass filter resonator. The resonators are merged into each other thus forming a nonlinear Fabry-Perot-type resonator having two oscillating modes in some embodiments. A nonlinear coupling between the resonators is achieved through one or more nonlinear capacitors (e.g., varactor diodes) in some embodiments. A coupling circuit is designed to ensure a reasonable Q-factor at both the fundamental and parametrically generated half-frequency signals in some embodiments.

Advantageously, when the amplitude of the signal at the input is small, the power of the signal is provided at the output of the FSL without being disturbed in some embodiments. When the amplitude of the signal at the input exceeds a certain threshold value, a parametrically generated half-frequency signal is provided in some embodiments. The amplitude of the half-frequency signal increases with the amplitude of the signal at the input, thus limiting the amplitude of the signal at the output in some embodiments.

The FSLs can be used to design auto-tune filters and can have a transfer function that depends upon the amplitude and phase of the input signal in some embodiments. The FSLs can include identical components (e.g., identical resonators and couplers) or can include components with different parameters (e.g., resonators and coupling circuits may vary from stage to stage), thereby allowing flexibility for the design of FSLs and auto-tune filters with desired characteristics, such as wide bandwidth, in some embodiments.

Figure 1:
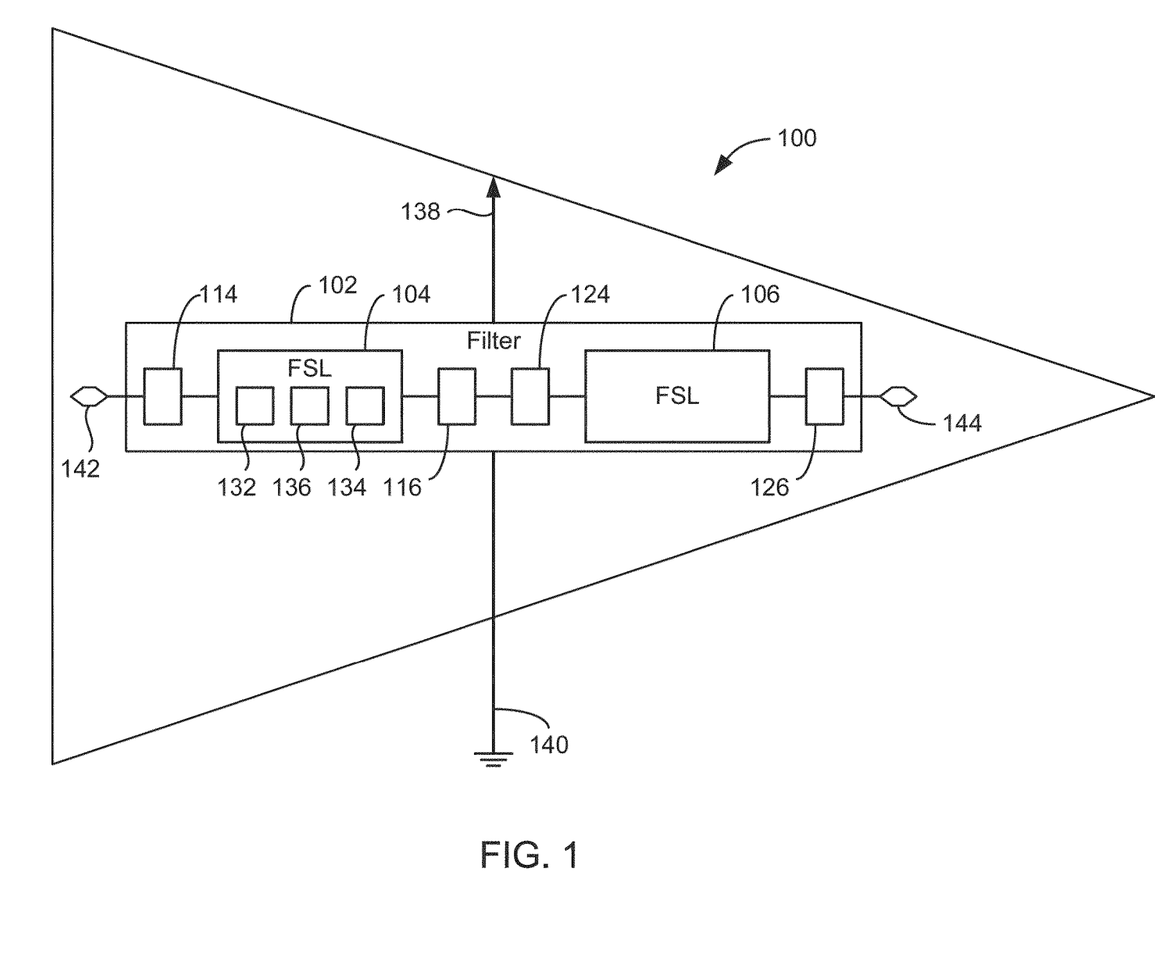
FIG. 1 is a general block diagram of a circuit including a filter including non-magnetic frequency selective limiters in accordance with an exemplary embodiment of the inventive concepts disclosed herein.

With reference to FIG. 1, a circuit 100 includes a filter 102. The filter 102 includes two or more FSLs 104 and 106 coupled to coupling circuits 114, 116, 124, and 126. The FSLs 104 and 106 are coupled in series with respect to each other. The coupling circuits 114 and 116 are in series with the FSL 104, and the coupling circuits 124 and 126 are in series with the FSL 106. The coupling circuits 116 and 124 are a single coupling circuit. In some embodiments, the FSLs are in parallel with respect to each other.

In some embodiments, the circuit 100 is an amplifier (e.g., a parametric amplifier). The filter 102 includes an input 142 and an output 144 and includes a power input 138 and a ground terminal 140. The filter 102 is used with or without the amplifier (e.g, in converters, receivers, and transmitters) and is combined with other circuit components in some embodiments.

The FSLs 104 and 106 include a resonator 132, a resonator 134 and a non-linear coupler 136. The resonator 134 is configured to oscillate at a frequency one half of the fundamental frequency that the resonator 132 is configured to oscillate in some embodiments. The resonators 132 and 134 are configured to oscillate at respective fundamental frequencies using inductive, capacitive and/or resistive characteristics and do not include magnetic material. In some embodiments, the resonators 132 and 134 include at least one capacitive element and at least one inductive element having respective capacitance and inductance values corresponding to the oscillation frequency of the respective resonators 132 and 134.

In some embodiments, each resonator 132 and 134 has 3 or more stages. Stages of the resonators 132 and 134 are implemented with lumped components or as stages of distributed transmission lines or are hybrid circuits consisting of both distributed and lumped components in some embodiments. The stages of the resonators 132 and 134 can be identical (consisting of identical lumped and distributed components). In some embodiments, the parameters of components may vary from stage to stage. The resonators 132 and 134 are merged into each other, thereby forming a Fabry/Perot resonator with two oscillating modes in some embodiments.

In some embodiments, the inductive and capacitive elements are discrete circuit board components. In some embodiments, the inductive and capacitive elements are micro strip printed circuit board or integrated circuit structures. Various circuitry in parallel or series can be used to provide the appropriate capacitance and inductance for the resonators 132 and 134.

The coupler 136 is a nonlinear coupler in some embodiments. In some embodiments, the coupler 136 includes one or more non-linear coupling devices, such as one or more varactor diodes. In some embodiments, coupler 136 includes one or more Schottky diodes.

The coupling circuits 114, 116, 124, and 126 are designed to ensure a reasonable Q-factor at both the fundamental and parametrically generated half frequency in some embodiments. The reasonable values the Q factor are dependent upon application parameters and design criteria. Reasonable Q factors are determined based upon desired bandwidth and insertion loss in some embodiments. The coupling circuits 114, 116, 124, and 126 include capacitive and inductive elements (e.g., an inductor in parallel with a capacitor) in some embodiments. The entire FSL/coupling circuit combination forms a Fabry-Perot resonator at both frequencies in some embodiments.

The circuit 100 and the filter 102 can be utilized in a variety of applications including but not limited to a multi-band and/or multi-signal type radio systems, electronic scanning arrays, high performance receivers, global positioning system devices, anti-jamming circuitry, cosite mitigation circuits, and other communication circuits. The circuit 100 and filter 102 can be utilized in a sensor or other application involving the reception of signals and bandwidth filtering. The present disclosure is not limited to any particular type of application or range of frequencies for the filter 102.

Figure 2:
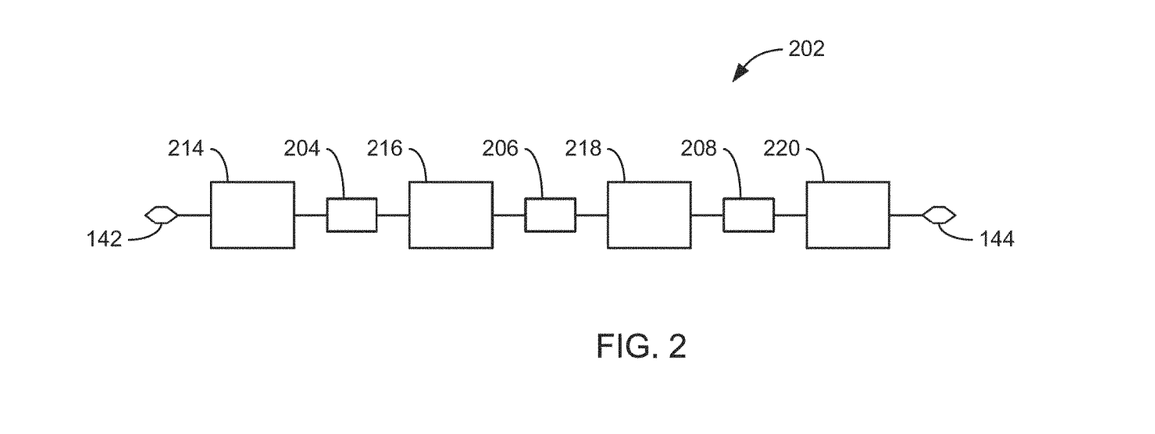
FIG. 2 is a more detailed electrical schematic diagram of a filter for the circuit illustrated in FIG. 1 including two non-magnetic frequency selective limiters in accordance with some embodiments.

With reference to FIG. 2, a filter 202 is similar to filter 102 and can be used as filter 102 in the circuit 100 (FIG. 1). The filter 202 includes non-magnetic FSLs 204, 206, and 208 which can be similar to the FSLs 104 and 106. The filter 102 includes coupling circuits 214, 216, 218 and 220. The FSLs 204, 206, and 208 are disposed in series with respect to each other and the coupling circuits 214, 216, 218 and 220. The filter 102 includes the input 142 and the output 144.

Figure 3:
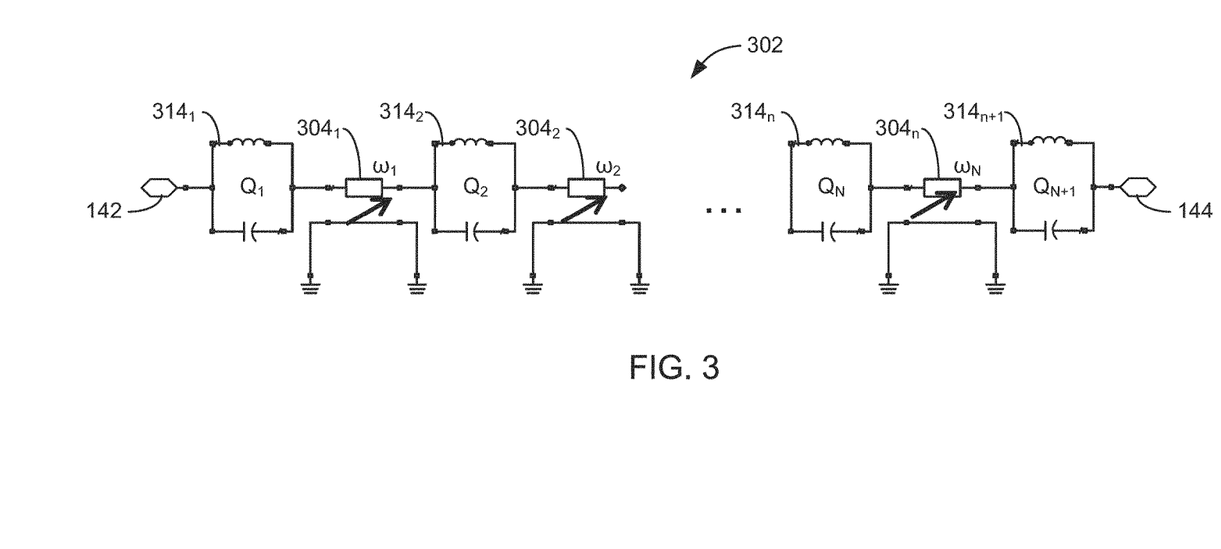
FIG. 3 is more detailed electrical schematic diagram of a filter for the circuit illustrated in FIG. 1 including three or more non-magnetic frequency selective limiters arranged in series in accordance with some embodiments.

With reference to FIG. 3, a filter 302 is similar to the filter 102 and can be used as filter 102 in the circuit 100 (FIG. 1). The filter 302 includes non-magnetic FSLs $304_1$, $304_2$, ..., $304n$ and coupling circuits $314_1$, $314_2$, ... $314_n$, and $314_{n+1}$ which can be similar to the FSLs 104 and 106 and the coupling circuits 114 and 116 respectively. The FSLs $304_1$-$304_n$ are disposed in series with respect to each other and the coupling circuits $314_1$-$314_{n+1}$, where n represents an integer. In some embodiments, n is 2, 3, 4, 5, 6, 7, 8, ..., 16. In some embodiments, n is greater than 16. Each of the FSLs $304_1$-$304_n$ are tuned to a particular frequency ($\omega_1$, $\omega_2$, ... $\omega_n$) in some embodiments, where $\omega$ is the fundamental frequency of the first resonator in the FSL. Similarly, each of coupling circuits $314_1$-$314_{n+1}$ are tuned for the appropriate Q factor ($Q_1$-$Q_n$) in some embodiments.

Figure 4:
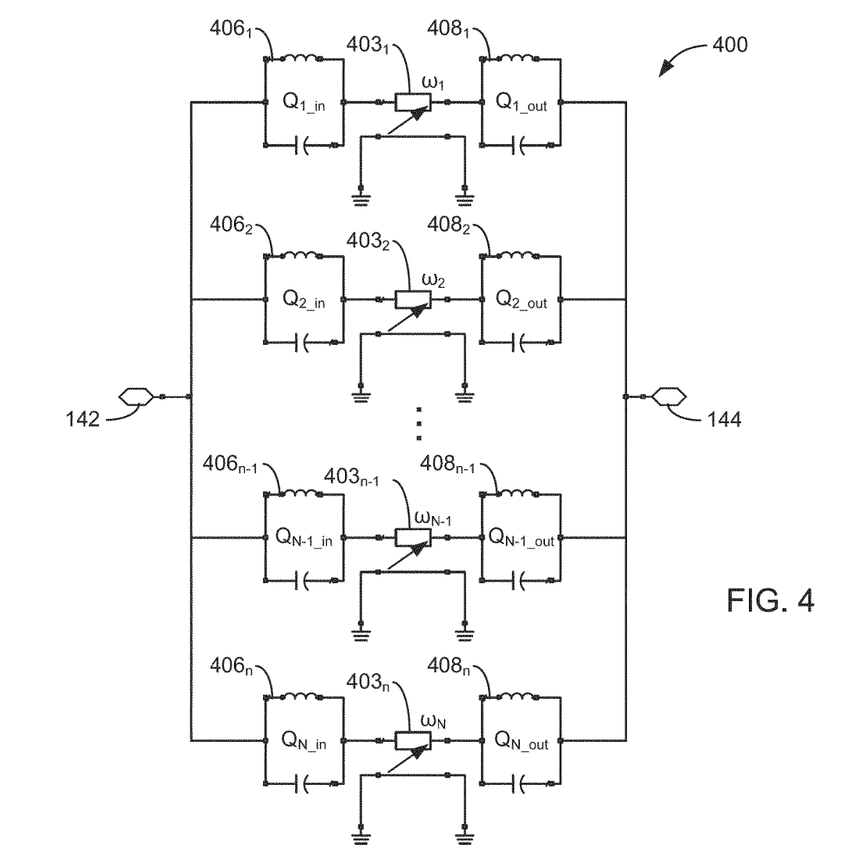
FIG. 4 is more detailed electrical schematic diagram of a filter for the circuit illustrated in FIG. 1 including three or more non-magnetic frequency selective limiters arranged in parallel in accordance with some embodiments.

With reference to FIG. 4, a filter 402 is similar to filter 102 and can be used as filter 102 in the circuit 100 (FIG. 1). The filter 402 is comprised of non-magnetic FSLs $403_1$-$403n$, each respectively coupled between coupling circuits $406_1$-$406_n$ and $408_1$-$408_n$. The FSLs $403_1$-$403_n$ can be similar to the FSLs 104 and 106 and the FSLs $304_1$-$304_n$. The coupling circuits $406_1$-$406_n$ and $408_1$-$408_n$ are similar to the coupling circuits 114 and 116 in some embodiments. The FSLs $402_1$-$402_n$ are in parallel with each other and n is any integer greater than or equal to 2. The coupling circuits $406a$-$406n$ are coupled between the input 142 and the FSLs $403_1$-$403_n$, respectively, in some embodiments. The coupling circuits $408_1$-$408_n$ are coupled between the output 144 and the FSLs $403_1$-$403_n$, respectively, in some embodiments.

Figure 5:
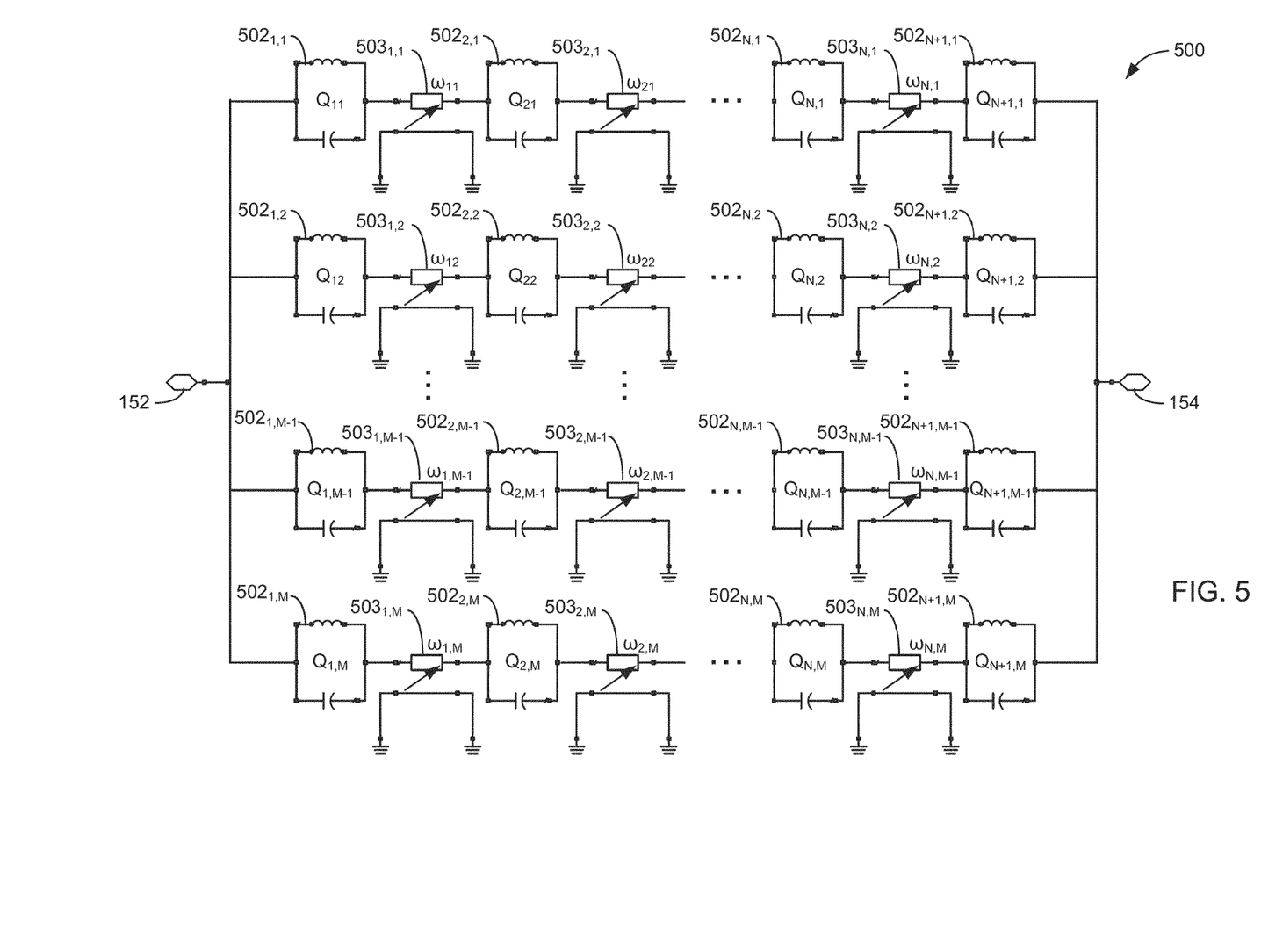
FIG. 5 is more detailed electrical schematic diagram of a filter for the circuit illustrated in FIG. 1 including non-magnetic frequency selective limiters arranged in parallel and series in accordance with some embodiments.

With reference to FIG. 5, the filter 502 is similar to the filter 102 and includes non-magnetic FSLs $502_{1,1}$-$502_{n,1}$, $502_{1,2}$-$502_{n,2}$, ..., $502_{1,m-1}$-$502_{n,m-1}$, and $502_{1,m}$-$502_{n,m}$ which can be similar to the FSLs 104 and 106 (FIG. 1) and the FSLs $304_1$-$304_n$ (FIG. 3). Filter 502 can be used as filter 102. The references m and n are integers (e.g., m and n are two or more). The filter 502 includes coupling circuits $504_{1,1}$-$504_{n+1,1}$, $504_{1,2}$-$504_{n+1,2}$, ..., $504_{1,m-1}$-$504_{n+1,m-1}$, and $504_{1,m}$-$504_{n+1,m}$. The FSLs $503_{1,1}$-$503_{1,n}$ are in series with each other and in parallel with the FSLs $503_{x,1}$-$503_{x,n}$ where x is 2 to m. As shown in FIGS. 1-5, serial and parallel connections for filters 102, 202, 302, 402, and 502 allow various configurations to be made. In some embodiments, filters 102, 202, 302, 402, and 502 are designed to have pass bands and stop bands at various frequencies. Configuring the filters 102, 202, 302 402, and 502 with parallel and serially connected FSLs allows the filters 102, 202, 302 402, and 502 to achieve numerous a number of bandwidths, frequency responses, stop bands, and other characteristics.

Figure 6:
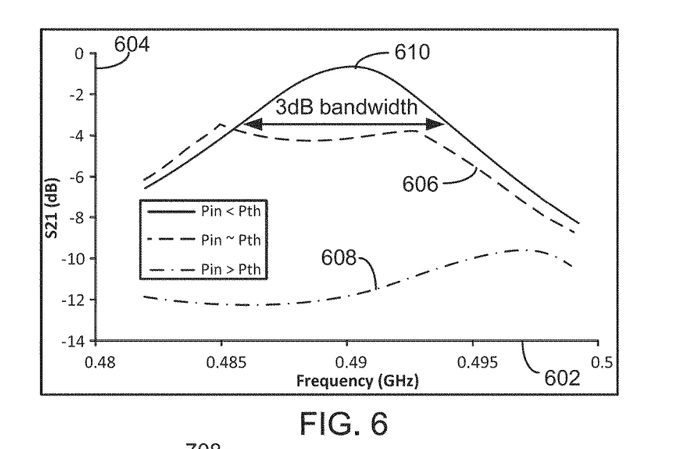
FIG. 6 is a diagram showing transmission properties for a single-stage non-magnetic frequency selective limiter filter in accordance with some embodiments.

With reference to FIG. 6, a y axis 604 represents power in dB for the transfer function S21 associated with a single stage filter (e.g., with a single FSL) (not shown) and an x axis 602 represents a frequency in gigahertz (GHz). Lines 606, 608 and 610 represent the transmitted power in dB associated with the single stage filter for input power at a threshold, above the threshold and below the threshold, respectively. The bandwidth at −3 dB is less than approximately 0.008 GHz.

Figure 7:
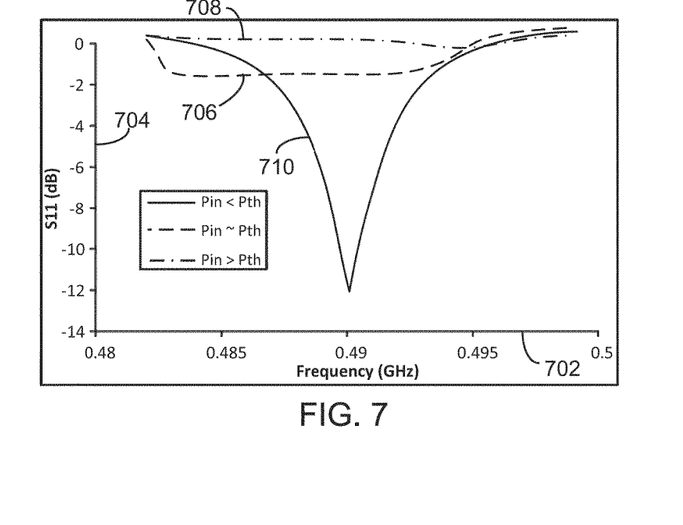
FIG. 7 is a diagram showing reflection properties for the single-stage non-magnetic frequency selective limiter filter characterized in FIG. 6 in accordance with some embodiments.

With reference to FIG. 7, a y axis 704 represents power in dB for the transfer function S11 associated with the single stage filter associated with FIG. 6 and an x axis 702 represents a frequency in GHz. Lines 706, 708 and 710 represent the reflected power in dB associated with a single stage FSL for input power at a threshold, above the threshold and below the threshold, respectively.

Figure 8:
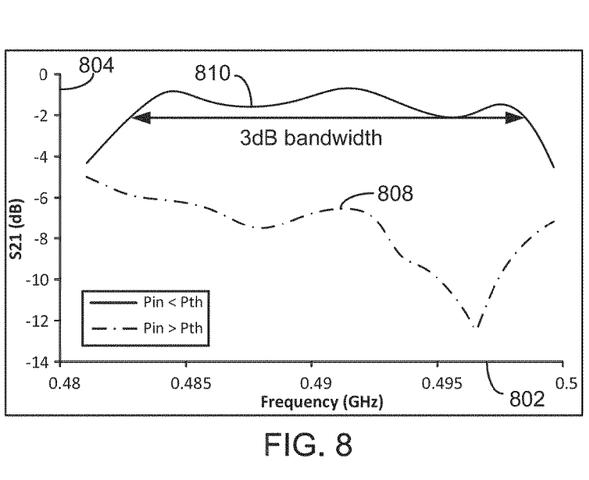
FIG. 8 is a diagram showing transmission properties for a multi-stage non-magnetic frequency selective limiter filter in accordance with some embodiments.

With reference to FIG. 8, a y axis 804 represents power in dB for the transfer function S21 associated with a multistage stage filter (e.g., a filter with four FSLs and five coupling circuits in series) and an x axis 802 represents a frequency in gigahertz GHz. Lines 808 and 810 represent the transmitted power in dB associated with the multistage filter for input power above a threshold and below the threshold, respectively. The bandwidth at −3 dB is approximately 0.016 GHz.

Figure 9:
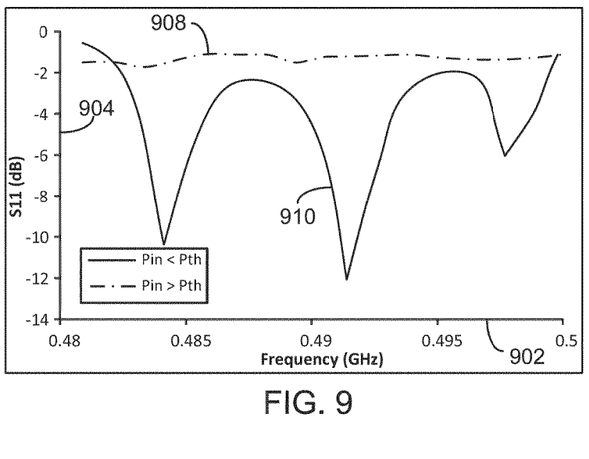
FIG. 9 is a diagram showing reflection properties for the multi-stage frequency selective limiter filter non-magnetic frequency selective limiter filter characterized in FIG. 7 in accordance with some embodiments.

With reference to FIG. 9, a y axis 904 represents power in dB for the transfer function S11 associated with a multistage stage filter (e.g., a filter with four FSLs in series) and an x axis 902 represents a frequency in GHz. Lines 808 and 810 represent the reflected power in dB associated with the multistage filter for input power above a threshold and below the threshold, respectively.

Figure 10:
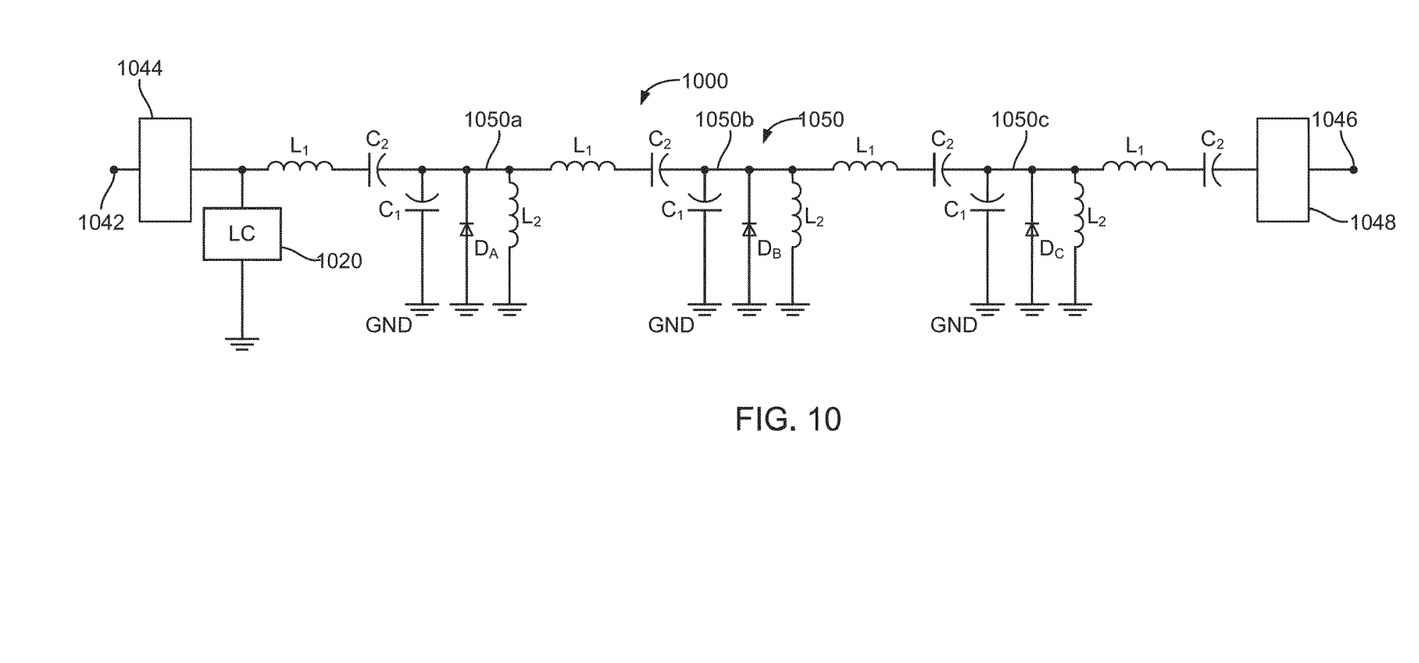
FIG. 10 is an electrical circuit diagram illustrating a non-magnetic material FSL with a first resonator parametrically coupled with a second resonator where the first and second resonators are merged in accordance with some embodiments.

With reference to FIG. 10, a non-magnetic FSL 1100 is similar to the FSL 104, can be used as FSL 104 in circuit 100 (FIG. 1) and includes a first resonator including capacitors $C_1$ having a first capacitance and inductors $L_1$ having a first inductance, a second resonator including capacitors $C_2$ having a second capacitance and inductors $L_2$ having a second inductance, and coupling varactor diodes $D_A$, $D_B$, and Dc in some embodiments. A coupling circuit 1044 is disposed between an input 1042 and the first and second resonators, and a coupling circuit 1048 is disposed between an output 1046 and the first and second resonators in some embodiments. The first resonator is parametrically coupled and merged with the second resonator. As shown in FIG. 10, the first and second resonators have three stages, each stage is associated with one of diodes $D_A$, $D_B$, and Dc.

The first and second resonator are provided between coupling circuits 1044 and 1048 similar to coupling circuits 114 and 116 (FIG. 1). The coupling circuits 1044 and 1048 act to partially reflect the signals between the coupling circuits 1044 and 1048, and thus act as semitransparent RF "mirrors" to the resonating structure of the non-magnetic material FSL 1100. The coupling circuits 1044 and 1048 may each include an inductor at a third inductance and a capacitor at a third inductance arranged in parallel, for example.

Each of the coupling varactor diodes $D_A$, $D_B$, and $D_C$ is in parallel with a respective capacitor $C_1$ and an inductor $L_2$ between a respective node $1050_{A-C}$ between a respective capacitor $C_2$ and inductor $L_1$ and ground in some embodiments. The first resonator has a fundamental frequency of $\omega_S$, and the second resonator has a fundamental frequency of $\omega_S/2$. The first resonator and the second resonator are non-linearly coupled by the diodes $D_A$, $D_B$, and $D_C$.

The FSL 1100 includes a filter 1020. The filter 1020 is an LC filter including an inductor and a capacitor in series in some embodiments. The filter 1020 is connected at one end to one of the coupling circuits 1046 and 1048 between that coupling circuit and the load, and connected at the other end to ground GND in some embodiments. The filter 1020 is tuned to cancel the half-frequency wave ($\omega_S/2$), and improves the limiting properties of the non-magnetic material FSL 1000. In some embodiments, the parasitic series resistance of the varactor diodes of the nonlinear coupling component of the non-magnetic material FSL 1000 can dissipate the half-frequency wave ($\omega_S/2$).

Figure 11:
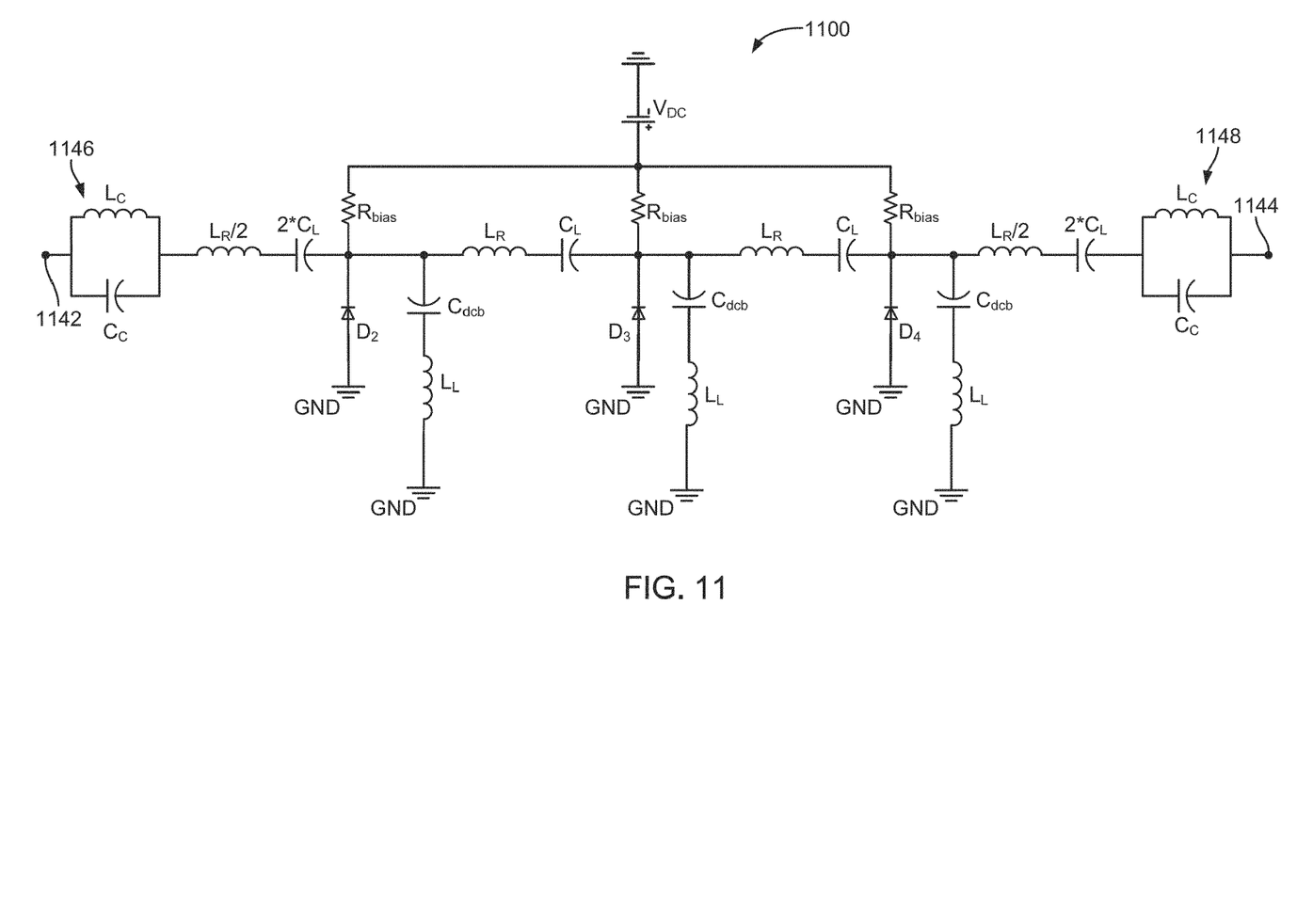
FIG. 11 is an electrical circuit diagram illustrating a non-magnetic material FSL having a single shunt diode arrangement in accordance with some embodiments.

With reference to FIG. 11, a non-magnetic material FSL 1100 is similar to the FSL 1000 (FIG. 10), can be used as FSL 104 in circuit 100 (FIG. 1), and includes a first resonator parametrically coupled with a second resonator. The non-magnetic material FSL 1100 has an input 1142 and an output 1144. The non-magnetic material FSL 1100 can have coupling circuits 1146 and 1148 coupled to the input 1142 and the output 1144, respectively. The coupling circuits 1146 and 1148 act to partially reflect the signals between the coupling circuits 1146 and 1148, and thus act as semitransparent RF "mirrors" to the resonating structure of the non-magnetic material FSL 1100. The coupling circuits 1146 and 1148 each include a capacitor $C_c$ and an inductor $L_c$.

The first resonator, oscillating at a fundamental frequency $\omega S$, includes the inductors $L_R/2$, $L_R$, and the capacitors $C_R$, while the second resonator, oscillating at one half the fundamental frequency $\omega_S/2$, includes inductors $L_L$, and the capacitors $C_L$ and $2*C_L$. The capacitors $2*C_L$ have twice the capacitance of the capacitors $C_L$, and the inductors $L_R/2$ have half the inductance of inductors $L_R$ in some embodiments. The DC block capacitor, $C_{dcb}$, is arranged to block direct current where one end of an adjacent inductors $L_L$ is connected to ground GND, and the other end to the block capacitor, $C_{dcb}$.

The load is connected to a voltage $V_{DC}$ via one or more bias resistors $R_{bias}$. The diodes $D_2$, $D_3$, and $D_4$ operate as nonlinear coupling components for the first and second resonators. The diodes $D_2$, $D_3$, and $D_4$ are shunt diodes coupled to the ground GND at one end, and to a respective bias resistor $R_{bias}$ at the other end.

Figure 12:
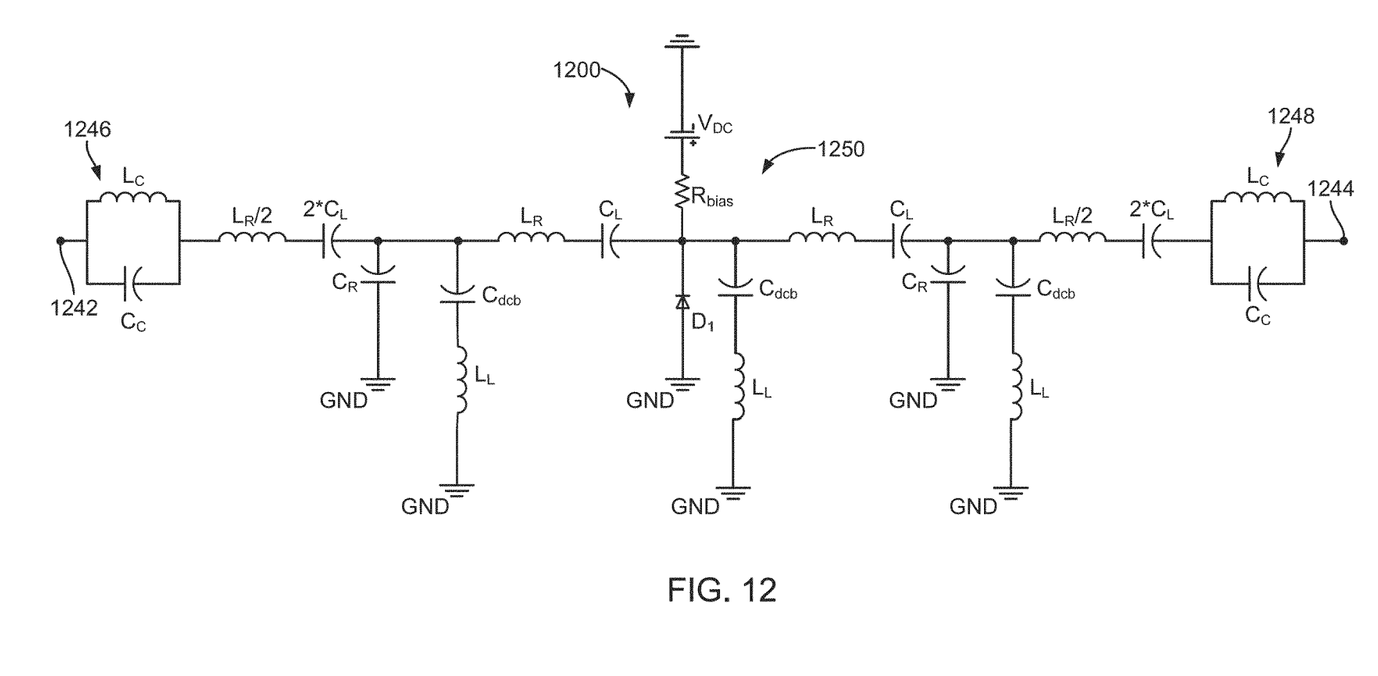
FIG. 12 an electrical circuit schematic diagram illustrating a non-magnetic material FSL having a three shunt diodes arrangement in accordance with some embodiments.

With reference to FIG. 12, a non-magnetic material FSL 1300 is similar to the FSL 1100, can be used as FSL 104 in circuit 100 (FIG. 1), and includes a first resonator parametrically coupled with the second resonator and a single shunt diode arrangement using a diode $D_1$ as opposed to the three shunt diode arrangement of the FSL 1100. The FSL has an advantage over a multi-diode arrangement FSL (e.g., the FSL 1100 (FIG. 11)) in reducing self-biasing where the half frequency wave goes out of synchronism at higher amplitude voltage inputs.

Although some embodiments are described with respect to radio frequency filters, the technology described herein can be utilized in other circuits. While the detailed drawings, specific examples, detailed algorithms, and particular configurations given describe preferred and exemplary embodiments, they serve the purpose of illustration only. The inventive concepts disclosed herein are not limited to the specific forms shown. The hardware configurations shown and described may differ depending on the chosen performance characteristics and physical characteristics. For example, the type of components and their interconnections may differ. The systems and methods depicted and described are not limited to the precise details and conditions disclosed. Further, other substitutions, modifications, changes, and omissions may be made in the design, operating conditions, and arrangement of the exemplary embodiments without departing from the scope of the invention as expressed in the appended claims. The inventive concepts disclosed herein not limited to the waveforms shown. It is understood that, while the exemplary embodiments have been described, they are for the purpose of illustration only. The inventive concepts disclosed herein should not be limited to the details disclosed. Various modifications will be apparent to those skilled in the art and is intended to include all such modifications and variations within the scope of the appended claims.

What is claimed is:

1. An apparatus for providing frequency selective power limiting, comprising:
    a first stage comprising:
        a first input port and a first output port,
        a first resonator configured to oscillate at a first fundamental frequency,
        a second resonator configured to oscillate at a second fundamental frequency, the second fundamental frequency being one half of the first fundamental frequency, and
        a first nonlinear coupler for coupling the first resonator and the second resonator in series, the first and second resonators are coupled in series with the first input port and the first output port; and
    a second stage, coupled to the first stage, comprising:
        a second input port and a second output port;
        a third resonator,
        a fourth resonator, and
        a second nonlinear coupler for coupling the third resonator and the fourth resonator in series, the third and fourth resonators are coupled in series with the second input port and the second output port.

2. The apparatus of claim 1, wherein the apparatus operates as a Fabry-Perot resonator.

3. The apparatus of claim 2, wherein the first nonlinear coupler further comprises a varactor diode.

4. The apparatus of claim 1, further comprising:
    a third stage comprised of
        a fifth resonator configured to oscillate at a third fundamental frequency;
        a sixth resonator configured to oscillate at a fourth fundamental frequency, the fourth fundamental frequency being one half of the third fundamental frequency; and
        a third nonlinear coupler between the fifth resonator and the sixth resonator.

5. The apparatus of claim 4, wherein the first resonator, the second resonator, and the first nonlinear coupler are coupled in parallel with the third resonator, the fourth resonator and the second nonlinear coupler.

6. The apparatus of claim 4, wherein the first resonator, the second resonator, and the first nonlinear coupler are coupled in series with the third resonator, the fourth resonator and the second nonlinear coupler.

7. The apparatus of claim 6, wherein the first resonator and the second resonator comprise a non-magnetic material.

8. The apparatus of claim 1, wherein the first resonator and the second resonator are comprised of transmission lines on a circuit board.

9. A filter, comprising:
    a first input port, a first output port,
    a first stage comprising a first resonator configured to oscillate at a first fundamental frequency, a second resonator configured to oscillate at a second fundamental frequency, the second fundamental frequency being one half of the first fundamental frequency, and a first nonlinear coupler for coupling the first resonator and the second resonator in series, the first and second resonators are coupled in series with the first input port and the first output port; and a second stage comprising a second input port, a second output port, a third resonator configured to oscillate at a third fundamental frequency, a fourth resonator configured to oscillate at a fourth fundamental frequency, the fourth fundamental frequency being one half of the third fundamental frequency, and a second nonlinear coupler for coupling the third resonator and the fourth resonator in series, the third and fourth resonators are coupled in series with the second input port and the second output port.

10. The filter of claim 9, wherein the first stage and the second stage are coupled in parallel.

11. The filter of claim 9, wherein the first stage and the second stage are in series and further comprising a third non-linear coupler disposed between the second resonator and the third resonator.

12. The filter of claim 9, wherein the first stage further comprises a fifth resonator, a sixth resonator, and a third nonlinear coupler between the fifth resonator and the sixth resonator.

13. The filter of claim 12, wherein the fifth resonator, the sixth resonator, and the third nonlinear coupler are in parallel with the first resonator, the second resonator, and the first nonlinear coupler.

14. The filter of claim 12, wherein the fifth resonator, the sixth resonator, and the third nonlinear coupler are coupled in series with the first resonator, the second resonator and the first nonlinear coupler.

15. The filter of claim 9, wherein the filter has a bandwidth at −3 dB of approximately 0.016 GHz.

16. A method of filtering an input signal, comprising:

providing the input signal to a staged filter comprising a first stage and a second stage, the first stage comprising: a first input port, a first output port, a first non-magnetic resonator configured to oscillate at a first fundamental frequency, a second non-magnetic resonator configured to oscillate at a second fundamental frequency, a first nonlinear coupler in series between the first non-magnetic resonator and the second non-magnetic resonator, the first and second non-magnetic resonators are coupled in series with the first input port and the first output port, and a pair of coupling circuits, the second fundamental frequency being one half of the first fundamental frequency; the second stage comprising: a second input port, a second output port, a third resonator, a fourth resonator, and a second nonlinear coupler in series between the third resonator and the fourth resonator; the first stage being in series or parallel with the second stage; and providing a filtered signal at an output of the staged filter corresponding to the second output port.

17. The method of claim 16, wherein the first non-magnetic resonator and the second non-magnetic resonator are formed using transmission lines on a circuit board.

18. The method of claim 17, wherein the second non-magnetic resonator provides an output signal.

19. The method of claim 17, wherein the input signal is a communication signal.

20. The method of claim 17, wherein the input signal is a radar signal.

* * * * *